(12) United States Patent
Koerner et al.

(10) Patent No.: US 11,287,482 B2
(45) Date of Patent: Mar. 29, 2022

(54) DUAL-VOLTAGE BATTERY WITH CURRENT SENSORS, AND CALIBRATION METHOD FOR THE SAME

(71) Applicant: HELLA GmbH & Co. KGaA, Lippstadt (DE)

(72) Inventors: André Koerner, Lippstadt (DE); Sebastian Kahnt, Karlstadt (DE); Juergen Krieger, Zellingen (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 163 days.

(21) Appl. No.: 16/419,738

(22) Filed: May 22, 2019

(65) Prior Publication Data

US 2019/0271748 A1 Sep. 5, 2019

Related U.S. Application Data

(63) Continuation of application No. PCT/EP2017/079477, filed on Nov. 16, 2017.

(30) Foreign Application Priority Data

Nov. 22, 2016 (DE) ...................... 10 2016 122 438.3

(51) Int. Cl.
*G01R 31/396* (2019.01)
*G01R 31/3842* (2019.01)
(Continued)

(52) U.S. Cl.
CPC .......... *G01R 31/396* (2019.01); *B60R 16/033* (2013.01); *G01R 31/3644* (2013.01);
(Continued)

(58) Field of Classification Search
CPC .............. G01R 31/396; G01R 31/3842; G01R 31/3644; G01R 35/00; G01R 19/0092;
(Continued)

(56) References Cited

U.S. PATENT DOCUMENTS

| 6,583,519 B2 | 6/2003 | Aberle et al. |
| 2007/0107767 A1 | 5/2007 | Hayden et al. |

(Continued)

FOREIGN PATENT DOCUMENTS

| DE | 10102243 A1 | 10/2002 |
| DE | 102013113182 A1 | 5/2015 |

(Continued)

*Primary Examiner* — Stewart A Fraser
(74) *Attorney, Agent, or Firm* — Muncy, Geissler, Olds & Lowe, P.C.

(57) ABSTRACT

A dual-voltage battery for a vehicle includes a multiplicity of battery cells, wherein a group of battery cells in each case is connected to form a battery cell block and a battery electronic system with a plurality of power switching elements for connecting at least individual battery cell blocks in series and/or in parallel, wherein a first voltage is provided in a first connection arrangement of the battery cell blocks and wherein a second voltage is provided in a second connection arrangement of the battery cell blocks, characterized in that a block current sensor with a measurement resistor is associated with at least individual battery cell blocks and is designed to measure a block current through the one associated battery cell block.

19 Claims, 4 Drawing Sheets

(51) Int. Cl.
    *H01M 10/48*     (2006.01)
    *B60R 16/033*     (2006.01)
    *G01R 31/36*     (2020.01)
    *G01R 35/00*     (2006.01)
    *H01M 10/04*     (2006.01)
    *G01R 19/00*     (2006.01)

(52) U.S. Cl.
    CPC ......... *G01R 31/3842* (2019.01); *G01R 35/00* (2013.01); *H01M 10/0445* (2013.01); *H01M 10/48* (2013.01); *H01M 10/482* (2013.01); *H01M 10/486* (2013.01); *B60Y 2400/112* (2013.01); *G01R 19/0092* (2013.01); *H01M 2220/20* (2013.01)

(58) Field of Classification Search
    CPC ............... H01M 10/48; H01M 10/486; H01M 10/0445; H01M 10/482; H01M 2220/20; B60R 16/033; B60Y 2400/112
    See application file for complete search history.

(56) References Cited

U.S. PATENT DOCUMENTS

| | | |
|---|---|---|
| 2011/0291619 A1 | 12/2011 | Asakura |
| 2014/0015488 A1* | 1/2014 | Despesse ............ H01M 10/486 320/122 |
| 2015/0364797 A1 | 12/2015 | Inaba et al. |
| 2018/0109122 A1 | 4/2018 | Koerner |

FOREIGN PATENT DOCUMENTS

| | | |
|---|---|---|
| DE | 102016116972 A1 | 3/2018 |
| EP | 2385575 A1 | 11/2011 |
| WO | WO2016150972 A1 | 9/2016 |

* cited by examiner

DUAL-VOLTAGE BATTERY WITH CURRENT SENSORS, AND CALIBRATION METHOD FOR THE SAME

This nonprovisional application is a continuation of International Application No. PCT/EP2017/079477, which was filed on Nov. 16, 2017, and which claims priority to German Patent Application No. 10 2016 122 438.3, which was filed in Germany on Nov. 22, 2016, and which are both herein incorporated by reference.

BACKGROUND OF THE INVENTION

Field of the Invention

The present invention relates to a dual-voltage battery for a vehicle and to a calibration method for a current measurement at a dual-voltage battery.

Description of the Background Art

A generic dual-voltage battery is known from DE 10 2013 113 182 A1, for example, and from German patent application 10 2016 116 972.2, which was published later. In each case, a group of battery cell blocks is provided that are connected to one another alternately in parallel and in series for the provision of a first, low voltage and a second, higher voltage at the terminals of the dual-voltage battery.

SUMMARY OF THE INVENTION

It is therefore an object of the present invention to provide a dual-voltage battery that has current sensors for monitoring the battery currents, and to specify a calibration method for the current sensors.

To attain the object, certain exemplary embodiments of the invention provide a dual-voltage battery for a vehicle, comprising a multiplicity of battery cells, wherein a group of battery cells in each case is connected to form a battery cell block, and comprising a battery electronic system with a plurality of power switching elements for connecting at least individual battery cell blocks in series and/or in parallel, wherein a first voltage is provided in a first connection arrangement of the battery cell blocks and wherein the first voltage and a second voltage are provided in a second connection arrangement of the battery cell blocks wherein a block current sensor with a measurement resistor is associated with at least individual battery cell blocks and is designed to measure a block current through the one associated battery cell block.

Whereas in the case of conventional dual-voltage batteries the total battery current provided by the battery as a whole can be detected and monitored by measurement means through a total battery current sensor, the dual-voltage battery according to the invention makes it possible in an advantageous manner to detect and to monitor the currents through the individual battery cell blocks separately through the provision of the block current sensors. By this means, detailed information is obtained about the functional state of the individual battery cell blocks, their loading in operation, or the charge state, with the result that the dual-voltage battery can be monitored reliably and operated safely. For example, a critical operating state can be detected at the level of the battery cell blocks. In this context, a reliable supply of the safety-critical electrical loads in the vehicle can be improved through the provision of a suitable connection of the battery cell blocks.

According to a preferred embodiment of the invention, a total battery current sensor that is designed to measure a total battery current of the dual-voltage battery is provided at a ground terminal of the dual-voltage battery. The total battery current is defined here as the sum of the block currents, which is to say the sum of the currents through the battery cell blocks. As a result of this design, the possibility advantageously exists of a redundant measurement of the currents in the battery and a monitoring of the function of the current sensors. The arrangement of the total battery current sensor at the ground terminal offers the advantage of simpler current measurement and evaluation.

Alternatively, however, the total battery current sensor can also be provided at one or more terminals of the dual-voltage battery.

According to an improvement of the invention, provision is made that the measuring accuracy of the battery current sensor is greater than a measuring accuracy of the block current sensors. Advantageously, by providing the total battery current sensor with suitably high measuring accuracy, it is possible to reduce the measuring accuracy of the block current sensors and to install inexpensive block current sensors. The cost for the dual-voltage battery is then reduced overall, with the total battery current sensor being provided for monitoring and, in particular for calibration, of the block current sensors. An adverse effect on the quality of the monitoring of the battery cell blocks can be avoided in this respect.

According to an improvement of the invention, the block current sensor is provided such that it is integrated into a cell monitor for the battery cells, wherein a voltage drop at the measurement resistor of the block current sensor and a voltage of the individual battery cells are fed to the cell monitor. The integration of the block current sensor system into the cell monitor for the battery cells of the battery cell block allows a functionally integrated and economical possibility for implementing the block current measurement. In particular, it is possible to preconfigure the cell monitor and to further reduce the costs for the dual-voltage battery with a small number of parts and comparatively simple assembly.

According to an improvement of the invention, the voltages at the individual battery cells of the battery cell block and the voltage drop across the measurement resistor of the block current sensor are fed to a sample-and-hold circuit. Advantageously, in this way the current and the voltage can be measured simultaneously and the sensor system or monitoring can be improved.

According to an improvement of the invention, the measurement resistor for the block current sensor is dimensioned such that a voltage drop across the measurement resistor is smaller by a factor of 10, or more, than a greatest voltage of the individual battery cells of the battery cell block associated with the block current sensor. Advantageously, the measurement can be carried out especially accurately as a result and an impermissible influencing of the function of the dual-voltage battery can be counteracted.

According to an improvement of the invention, a connecting lead for the battery cell blocks of the dual-voltage battery or an internal resistance of the power switching elements serves as measurement resistor for the block current sensor. The advantageous result is an especially inexpensive design of the dual-voltage battery according to the invention. For example, a temperature sensor can be associated with the measurement resistor and, in particular, with the connecting lead, by which means an influence of temperature on the measurement result can be detected and subsequently the influence of the temperature can be eliminated.

To attain the object, a calibration method according to the invention for a dual-voltage battery comprising a multiplicity of battery cell blocks, comprising power switching elements for alternately connecting the battery cell blocks in series and/or in parallel in such a manner that, in a first connection arrangement, at least individual battery cell blocks are connected in parallel and a first voltage is provided and that in a second connection arrangement, a group of battery cell blocks is connected in series and a second voltage is provided, comprising a block current sensor for measuring a block current through one of the battery cell blocks, and comprising a total battery current sensor with which the total battery current through the dual-voltage battery is measured, makes provision in this regard that in a calibration operating mode of the dual-voltage battery at least one load of the dual-voltage battery is supplied with power, that all battery cell blocks not associated with the block current sensor are disconnected by means of the power switching elements, that the block current and the total battery current are then measured, and that the block current sensor is calibrated on the basis of a measured value of the battery current sensor.

A particular advantage of the invention is that, in the calibration operating mode of the dual-voltage battery, the same current is measured by the block current sensor and the total battery current sensor, and in this regard the same measurement result must be determined. If there are deviations between the measurement results, knowledge about the physical relationships, namely the awareness that the measured currents are identical, can be used for calibration of the sensors. In particular, the total battery current sensor can be provided with a high measuring accuracy. The measurement result that the total battery current sensor supplies can then be used for calibration of a block current sensor that is inexpensive and measures with less accuracy. Since a block current sensor is associated with every battery cell block in a preferred configuration of the dual-voltage battery according to the invention, the accuracy that is lacking of the measurement can be corrected with the use of the calibration method according to the invention and a sequential, demand-dependent, and/or cyclic performance of the calibration for the block current sensors. Low-cost and less accurate current sensors can thus be provided for the block current sensors. For example, inexpensive SMD shunt based current sensors can be used for the block current sensors. For the total battery current sensor, in contrast, a high-accuracy shunt and an ASIC can be used, wherein a decoupling of the signals can be achieved through impedance transformers. The ASIC of the total battery current sensor can be replaced by inexpensive, standard operational amplifiers for the block current sensors.

According to a preferred embodiment of the invention, an additional electrical load is temporarily activated in the calibration operating mode of the dual-voltage battery. While the additional electrical load is activated, which is to say energized, the block current through the battery cell block and the total battery current are measured again. An additional measuring point is then known for the calibration of the block current sensors. The calibration can be performed especially accurately in this respect.

According to an improvement of the invention, a 0 ampere calibration is carried out for the block current sensor, for example for a disconnected battery cell block, through which no current flows. The 0 ampere calibration can be performed, for example, for a parallel-connected battery cell block that is temporarily disconnected for the duration of the 0 ampere calibration. For example, the 0 ampere calibration can be carried out during ongoing operation for a battery cell block that is being switched over between the parallel and the series configuration, which is to say from the first connection arrangement into the second connection arrangement or back again. The battery cell block is briefly disconnected during the switchover, however, so that no current flows through the battery cell block for a short time. Advantageously, an additional data point for the calibration of the block current sensors can be acquired and/or a zero point error can be compensated for by the 0 ampere calibration. In this regard, it succeeds in further improving the accuracy of the calibration method.

Additional advantages, features, and details of the invention are evident from the additional dependent claims and the description below. Features mentioned therein can each be essential for the invention individually or in any desired combination. Of course, features and details of the dual-voltage battery described according to the invention also apply in connection with the calibration method according to the invention and vice versa. Thus, mutual reference can always be made to the disclosure of the individual aspects of the invention. The drawings serve merely to clarify the invention by way of example and are not restrictive in nature.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

The invention is explained in detail below on the basis of the attached drawings. They show.

DETAILED DESCRIPTION

Figure 1:
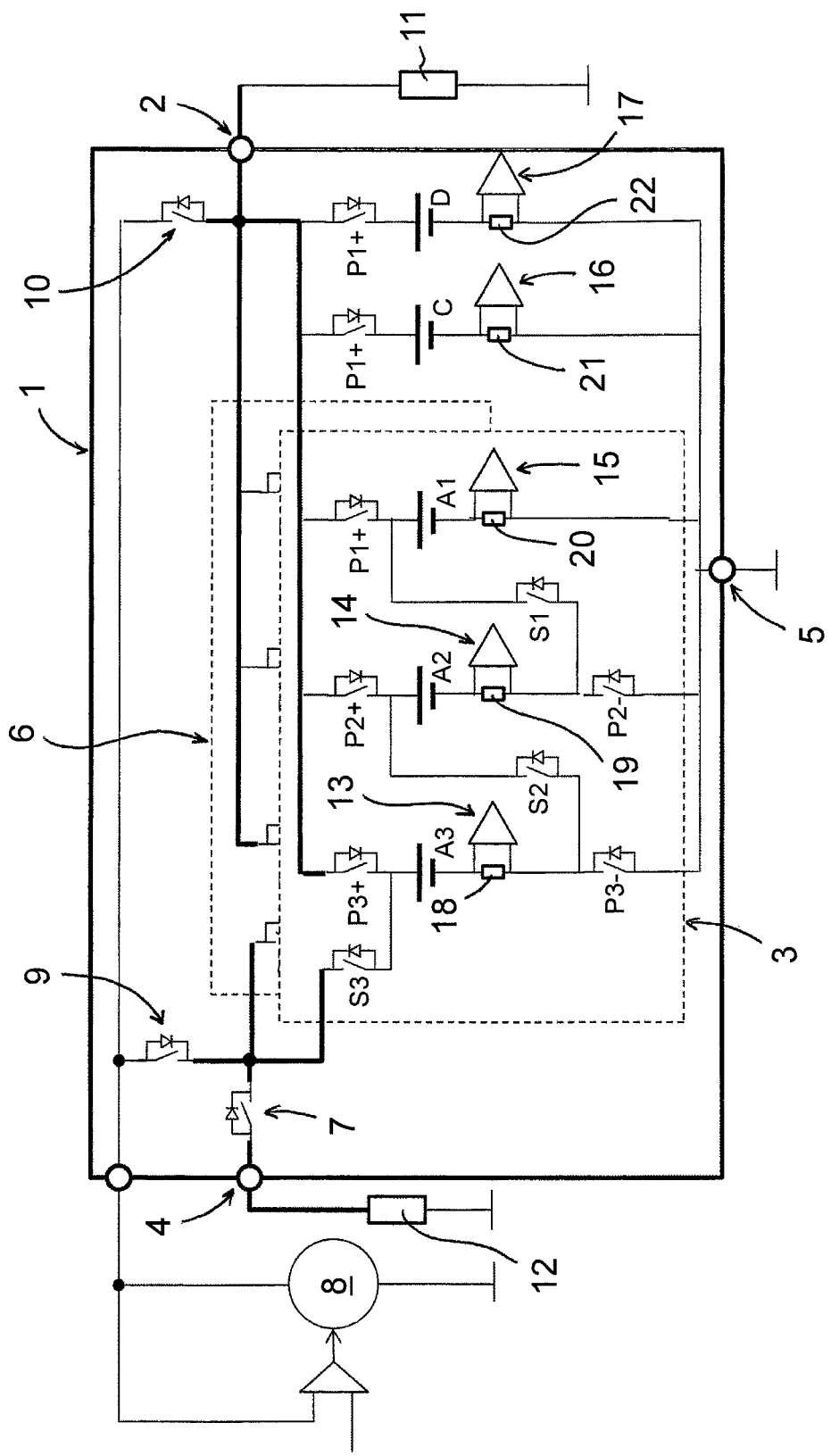
FIG. 1 is a schematic circuit diagram of a dual-voltage battery according to the invention in a first configuration.

A first configuration of a dual-voltage battery 1 according to the invention from FIG. 1 includes a total of eight battery cell blocks that preferably are identical in design, of which three battery cell blocks A1, A2, A3 form a first group 3 of battery cell blocks and another three battery cell blocks, which are hidden in FIG. 1 by the first group 3, form a second group 6 of battery cell blocks. Two additional battery cell blocks C, D are connected in parallel with the first group 3 and the second group 6 of battery cell blocks. The additional battery cell blocks C, D are connected to one another in parallel and are separably connected to a first terminal 2 of the dual-voltage battery 1 by a first power switching element P1+. Through the first power switching element P1+ and additional power switching elements P2+, P2−, P3+, P3−, S1, S2, S3, the three battery cell blocks A1, A2, A3 of the first group 3 of battery cell blocks are connected in parallel with one another and are connected to the first terminal 2 of the dual-voltage battery 1 in a first connection arrangement, or are connected in series in a second connection arrangement of the dual-voltage battery 1. In the series connection of the battery cell blocks A1, A2, A3 of the first group 3, a second, higher voltage is provided at a second terminal 4 of the dual-voltage battery 1 by the battery cell blocks A1, A2, A3. The first voltage provided at the first terminal 2 and the higher second voltage provided at the second terminal 4 are each referenced to a common ground point 5 of the dual-voltage battery 1.

In addition to the first group 3 of battery cell blocks A1, A2, A3, the second group 6 of battery cell blocks is provided. Like the first group 3, the second group 6 comprises three battery cell blocks. The structure of the second group 6 of battery cell blocks is analogous to the structure of the first group 3 of battery cell blocks A1, A2, A3. In particular, the second group 6 of battery cell blocks also provides power switching elements for optionally connecting the battery cell blocks in parallel and/or in series. In this regard, the first voltage and/or the second voltage can be provided at the first terminal 2 and/or the second terminal 4 of the dual-voltage battery 1 by the battery cell blocks of the second group 6 as a function of the connection arrangement of the battery cell blocks. Moreover, with respect to the second voltage supplied at the second terminal 4, a switching element 7 is provided that is closed in the second connection arrangement and open in the first connection arrangement.

In addition, a starter-generator 8 is associated with the dual-voltage battery 1 by way of example, through which the battery cells of the battery cell blocks A1, A2, A3, C, D can be powered. Energy recovery can be implemented by means of the starter-generator 8. In particular, braking energy can be converted into electrical energy and stored in the dual-voltage battery 1 within the scope of energy recovery. Depending on the configuration of the dual-voltage battery 1, the starter-generator 8 can be connected in a voltage-dependent manner at the first voltage and/or at the second voltage through additional switching elements 9, 10.

Electrical loads 11, 12 in the electrical system of the vehicle are electrically powered at the first voltage and/or at the second voltage by means of the dual-voltage battery 1. Supply to the electrical loads 11 operated at the first voltage takes place in this regard through the first terminal 2 of the dual-voltage battery 1 and supply to the electrical loads 12 at the second voltage takes place through the second terminal 4 of the dual-voltage battery 1.

Block current sensors 13, 14, 15, 16, 17 are associated with the individual battery cell blocks A1, A2, A3, C, D of the dual-voltage battery 1 for determining the block currents. Each block current sensor 13, 14, 15, 16, 17 in this design provides a measurement resistor 18, 19, 20, 21, 22 at which the block current is measured. The measurement resistors 18, 19, 20, 21, 22 here are connected in series with the battery cell blocks A1, A2, A3, C, D. Due to the measurement of the block currents for the individual battery cell blocks A1, A2, A3, C, D, the charging state can be determined for each battery cell block A1, A2, A3, C, D during operation, so that overcharging or undercharging of the individual battery cell blocks A1, A2, A3, C, D can be counteracted. In addition, it is possible to keep the charge for all battery cell blocks A1, A2, A3, C, D at an approximately equal level. In this regard, the invention succeeds in counteracting a very different charging state of the battery cell blocks A1, A2, A3, C, D.

Figure 2:
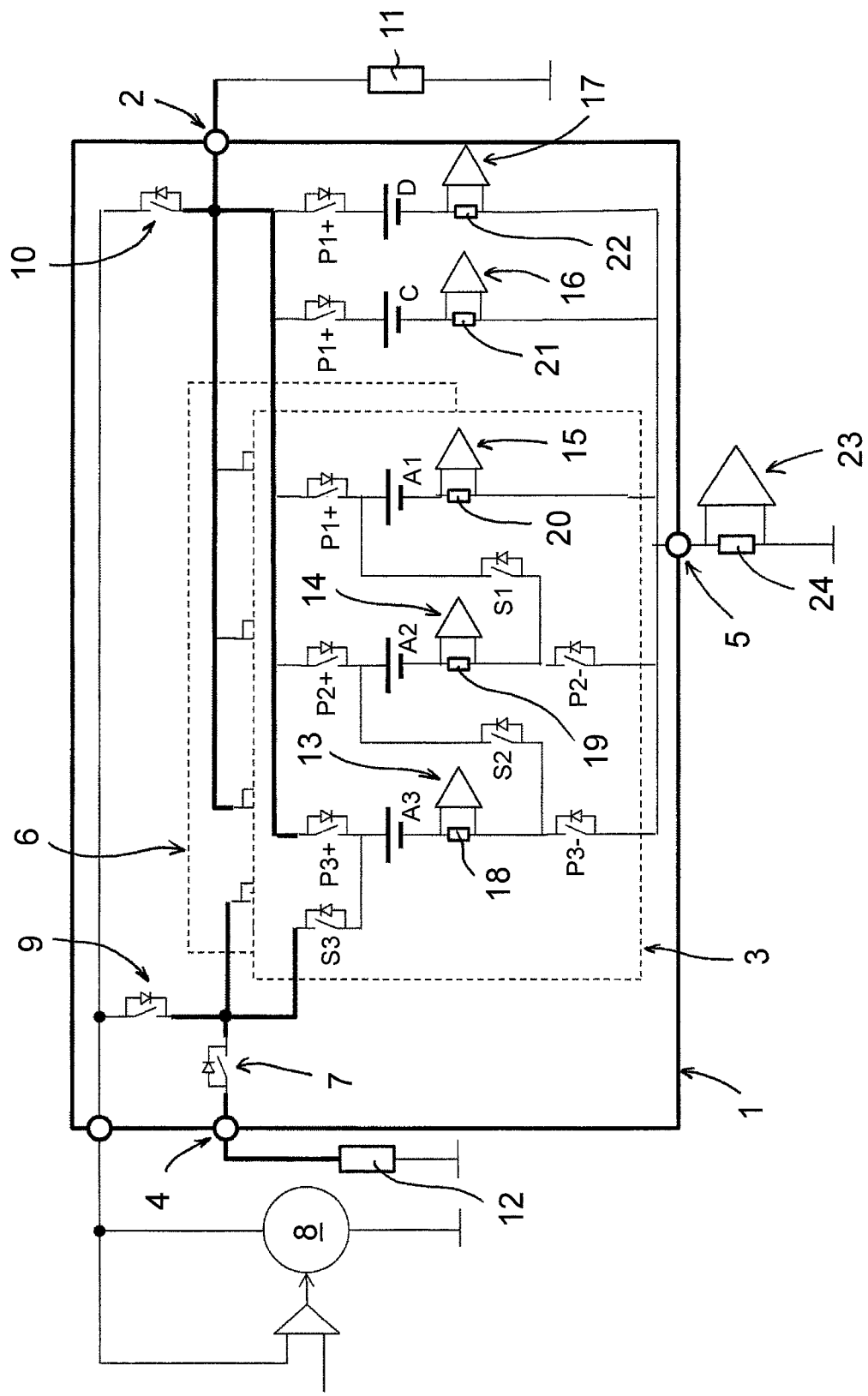
FIG. 2 is a schematic circuit diagram of the dual-voltage battery according to the invention in a second configuration.

In a second configuration of the dual-voltage battery 1 according to the invention from FIG. 2, a total battery current sensor 23 with a measurement resistor 24 is additionally associated with the ground terminal 5. By means of the total battery current sensor 23, the total battery current can be determined in addition to the block currents. Otherwise, the configuration of the dual-voltage battery 1 is unchanged.

Advantageously, a cost reduction for the dual-voltage battery 1 as a whole can be achieved through the provision of the additional total battery current sensor 23 when the total battery current sensor 23 has high measuring accuracy and the block current sensors 13, 14, 15, 16, 17 are implemented inexpensively with a comparatively low measuring accuracy. For example, the measurement resistor 24 of the total battery current sensor 23 can be highly accurate in design and an ASIC can be provided. In contrast, the block current sensors 13, 14, 15, 16, 17 can be implemented on an SMD shunt basis, and inexpensive, standard operational amplifiers can be provided instead of the ASIC. In this regard, only one high-accuracy current sensor 23 and a multiplicity of inexpensive, less accurate block current sensors 13, 14, 15, 16, 17 are required.

Monitoring of the dual-voltage battery 1 that is nevertheless reliable is realized through a calibration of the block current sensors 13, 14, 15, 16, 17 that is carried out at least once and preferably repeatedly. In this process, the electrical load 11 is supplied with electric power by the dual-voltage battery 1 in a calibration operating mode of the dual-voltage battery 1. In order to supply the electrical load 11, a first additional battery cell block C of the dual-voltage battery 1 is initially connected, for example, while all other battery cell blocks A1, A2, A3, D are disconnected. In the circuit arrangement, the total battery current measured by the total battery current sensor 23 is provided solely by the first additional battery cell block C with the consequence that a block current detected by the less accurate block current sensor 16 associated with the first additional battery cell block C must correspond to the total battery current. Thus, if there is a deviation in the measurement results here, the block current sensor 16 associated with the first additional battery cell block C is calibrated on the basis of the measured value for the high-accuracy total battery current sensor 23.

After the calibration of the block current sensor 16 associated with the first additional battery cell block C, the calibration of the other block current sensors 13, 14, 15, 17 can be carried out sequentially in analogous fashion. The calibration can be carried out when the vehicle is parked, for example.

An improvement in the calibration of the block current sensors 13, 14, 15, 16, 17 can be achieved if an additional electrical load is activated at least temporarily while the block current sensors 13, 14, 15, 16, 17 are being calibrated. An additional data point for the calibration of the block current sensors 13, 14, 15, 16, 17 can then be determined.

A 0 ampere calibration of the block current sensors 13, 14, 15, 16, 17 can be carried out, for example, when a selected battery cell block A1, A2, A3, C, D is at least temporarily disconnected. In this disconnected operating state, no block current flows. A calibration of the block current sensors 13, 14, 15, 16, 17 for the 0 ampere state can be performed reliably in this respect. The disconnection of the battery cell block A1, A2, A3, C, D for the 0 ampere calibration can take place, for example, during ongoing operation for a parallel-connected battery cell block A1, A2, A3, C, D when this block is temporarily disconnected for the duration of the 0 ampere calibration. Likewise, the 0 ampere calibration can be carried out when a battery cell block A1, A2, A3, C, D is being switched from the series into the parallel configuration or back again during ongoing operation. When the configuration is being changed, the battery cell block A1, A2, A3, C, D is at least temporarily disconnected. During the temporary disconnection, the 0 ampere calibration for the block current sensor 13, 14, 15, 16, 17 can be carried out.

Figure 3:
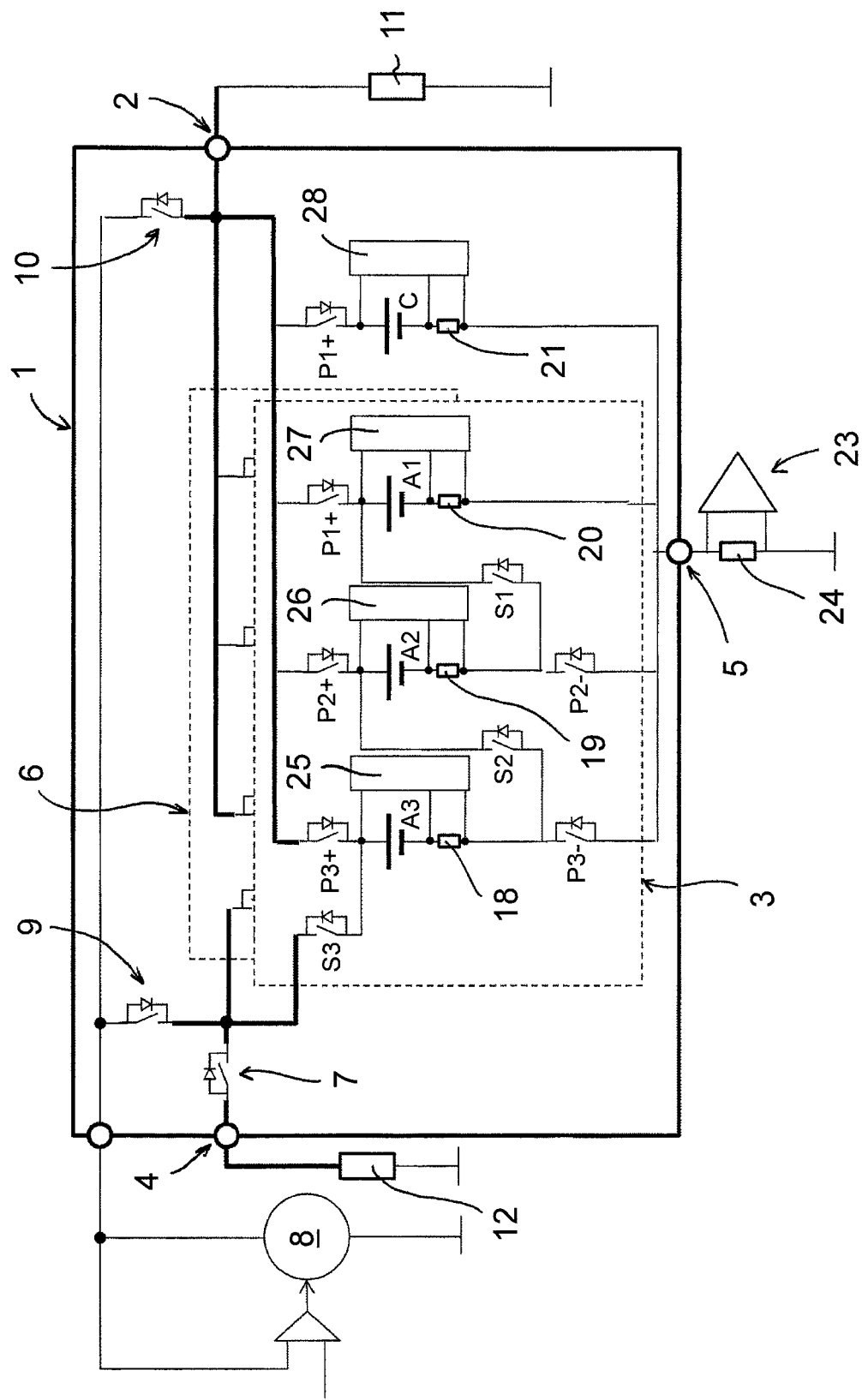
FIG. 3 is a schematic circuit diagram of the dual-voltage battery according to the invention in a third configuration.

In a third configuration of the dual-voltage battery 1 according to the invention from FIG. 3, provision is made that the measurement of the block current is functionally and/or spatially integrated into a cell monitor 25, 26, 27, 28, taking place in an integrated manner. The cell monitor 25, 26, 27, 28 serves to detect the voltage for each individual battery cell of the battery cell blocks A1, A2, A3, C. In addition, a voltage drop across the measurement resistor 18, 19, 20, 21 is detected for the determination of the block currents. For example, the cell monitor 25, 26, 27, 28 can be implemented as a sample-and-hold circuit, with which the voltages and currents can be determined simultaneously. A size of the measurement resistor 18, 19, 20, 21 is preferably smaller by an order of magnitude than the largest voltage of a battery cell of the individual battery cell blocks A1, A2, A3, C, D.

Solely by way of example, an additional, parallel-connected battery cell block has been dispensed with in the third configuration of the dual-voltage battery 1. Fundamentally speaking, the implementation of the dual-voltage battery 1 according to the invention and the carrying out of the calibration method according to the invention are not limited to the provision of seven or eight battery cell blocks A1, A2, A3, C, D. In this respect, it is essential for the invention that at least one group 3, 6 of battery cell blocks A1, A2, A3 can be variably connected for the provision of the first voltage and/or the second voltage and that the block currents are detected, at least for individual and preferably for all battery cell blocks A1, A2, A3, C, D, and a calibration of the block current sensors 13, 14, 15, 16, 17 on the basis of the total battery current can take place as necessary. The additional battery cell blocks C, D can be dispensed with, for example.

Figure 4:
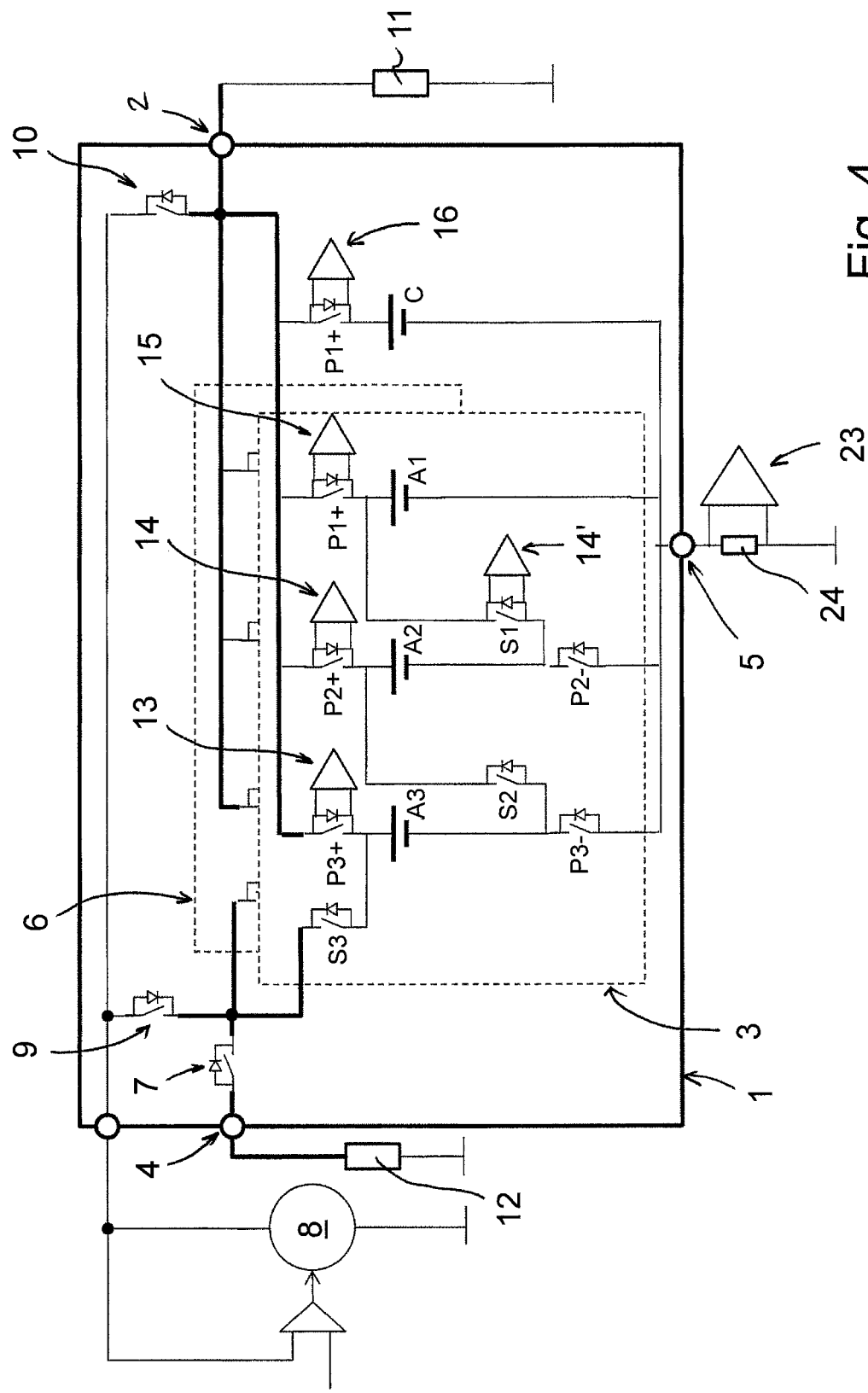
FIG. 4 a schematic circuit diagram of the dual-voltage battery according to the invention in a fourth configuration.

FIG. 4 shows a fourth configuration of the dual-voltage battery 1 according to the invention, in which the use of additional measurement resistors is dispensed with. The block current sensors 13, 14, 14', 15, 16 are associated directly with the associated power switching elements P1+, P2+, P3+, P2−, P3−, S1 in this respect. Resistances provided in the power switching elements P1+, P2+, P3+, P2−, P3−, S1 are provided here simultaneously as measurement resistors for the block current measurement. The fourth configuration can be implemented in an especially compact and economical manner in this respect.

According to an alternative configuration of the dual-voltage battery 1 according to the invention, it is possible to dispense with separate measurement resistors even in the case when the connecting leads alternatively provided between the battery cell blocks A1, A2, A3, C, D are used for current measurement. The connecting leads, which are normally made of copper or a copper alloy, can have an associated temperature sensor for compensation of the copper temperature coefficient, by which means the temperature effects in the measurement can be compensated for. Alternatively, provision can be made that the connecting leads are made of a material other than copper, or a copper alloy, that has a higher resistance and/or better temperature stability. For example, brass, bronze, steel, or corresponding alloys can be used.

The same components and component functions are labeled with the same reference symbols.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A dual-voltage battery for a vehicle, comprising:
a plurality of battery cells, wherein a group of battery cells is connected to form a number of battery cell blocks;
a battery electronic system with a plurality of power switching elements; and
a total battery current sensor, designed to measure a total battery current of the dual-voltage battery, provided at a ground terminal of the dual-voltage battery,
wherein a first voltage is provided in a first connection arrangement of the battery cell blocks,
wherein a second voltage is provided in a second connection arrangement of the battery cell blocks,
wherein the battery cells blocks, with the plurality of power switching elements, are configured to be connected in series and in parallel, and
wherein a block current sensor with a measurement resistor is associated with at least individual battery cell blocks and is designed to measure a block current through the one associated battery cell block.

2. The dual-voltage battery according to claim 1, wherein a total battery current sensor that is designed to measure a total battery current of the dual-voltage battery is provided at one or more terminals of the dual-voltage battery.

3. The dual-voltage battery according to claim 1, wherein a measuring accuracy of the total battery current sensor is greater than a measuring accuracy of at least one of the block current sensors.

4. The dual-voltage battery according to claim 1, wherein all block current sensors are identical in design.

5. The dual-voltage battery according to claim 1, wherein the block current sensor is provided so as to be integrated at least partially into a cell monitor for the battery cells of the battery cell block associated with the block current sensor, and
wherein a voltage drop at the measurement resistor is fed to the cell monitor.

6. The dual-voltage battery according to claim 1, wherein the measurement resistor is dimensioned such that the voltage drop at the measurement resistor is smaller by at least a factor of 10 and preferably by a factor of 100 or more than a greatest voltage of the individual battery cells of the battery cell block.

7. The dual-voltage battery according to claim 1, wherein the voltage of the individual battery cells of the battery cell block and the voltage drop across the measurement resistor of the block current sensor associated with the battery cell block are fed to a sample-and-hold circuit for the simultaneous measurement of voltage and current.

8. The dual-voltage battery according to claim 1, wherein a connecting lead for the battery cell blocks or a part of the connecting lead serves as measurement resistor for the block current sensor.

9. The dual-voltage battery according to claim 8, wherein a temperature sensor is associated with the connecting lead or the part of the same.

10. The dual-voltage battery according to claim 1, wherein an internal resistance of the power switching element is provided as measurement resistor for the block current sensor.

11. The dual-voltage battery according to claim 1, wherein an individual block current sensor is associated with each battery cell block.

12. The dual-voltage battery according to claim 1, wherein additional battery cell blocks are arranged in parallel with the battery cell blocks that can be optionally connected in parallel or in series, and
wherein the first voltage is provided by the additional battery cell blocks.

13. A calibration method for the dual-voltage battery according to claim 1, comprising:
in a first connection arrangement, connecting in parallel at least individual battery cell blocks and providing a first voltage;
in a second connection arrangement, connecting a group of battery cell blocks in series and providing a second voltage;
measuring, using the block current sensor, the block current through the battery cell block associated with the block current sensor; and
measuring, using a total battery current sensor, total battery current through the dual-voltage battery is measured;
wherein in a calibration operating mode of the dual-voltage battery at least one load of the dual-voltage battery is supplied with power,
wherein all battery cell blocks not associated with the block current sensor are disconnected by means of the power switching elements, and
wherein the block current and the total battery current are then measured, and wherein the block current sensor is calibrated on the basis of a measured value of the total battery current.

14. The calibration method according to claim 13, wherein an additional electrical load is temporarily activated in the calibration operating mode and the block current and the total battery current are measured again.

15. The calibration method according to claim 13, wherein, in a disconnected operating state of the dual-voltage battery, in which at least one battery cell block is not connected, a 0 ampere calibration is carried out for the at least one disconnected battery cell block by means of the block current sensor associated with the at least one disconnected battery cell block.

16. The calibration method according to claim 15, wherein the 0 ampere calibration is carried out during ongoing operation for a parallel-connected battery cell block that is temporarily disconnected for the duration of the measurement.

17. The calibration method according to claim 15, wherein the 0 ampere calibration is carried out during ongoing operation for a battery cell block that is being switched over between the series and the parallel configuration, wherein the battery cell block is at least briefly disconnected during the switchover.

18. The dual-voltage battery according to claim 1, wherein the total battery current sensor includes an application-specific integrated circuit measurement resistor, and
wherein the measurement resistors of the plurality of individual block current sensors comprise standard operational amplifiers.

19. A dual-voltage battery for a vehicle, comprising:
a plurality of battery cells, wherein a group of battery cells is connected to form a number of battery cell blocks;
a battery electronic system with a plurality of power switching elements for connecting the battery cell blocks in series or in parallel;
a plurality of individual block current sensors, each having a measurement resistor, each of the plurality of individual block current sensors being associated with an individual battery cell block of the number of battery cell blocks, and each of the plurality of individual block current sensors being designed to measure a block current through an associated battery cell block; and
a total battery current sensor, designed to measure a total battery current of the dual-voltage battery, provided at a ground terminal of the dual-voltage battery,
wherein a first voltage is provided in a first connection arrangement of the battery cell blocks, and
wherein a second voltage is provided in a second connection arrangement of the battery cell blocks.

* * * * *